US012068690B2

(12) United States Patent
Blyth (10) Patent No.: US 12,068,690 B2
(45) Date of Patent: *Aug. 20, 2024

(54) CONTROL CIRCUITRY FOR CONTROLLING A POWER SUPPLY

(71) Applicant: Cirrus Logic International Semiconductor Ltd., Edinburgh (GB)

(72) Inventor: Malcolm Blyth, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,747

(22) Filed: Aug. 22, 2023

(65) Prior Publication Data

US 2023/0396167 A1  Dec. 7, 2023

Related U.S. Application Data

(63) Continuation of application No. 17/245,188, filed on Apr. 30, 2021, now Pat. No. 11,784,565.

(Continued)

(30) Foreign Application Priority Data

Oct. 2, 2020 (GB) ..................... 2015631

(51) Int. Cl.
*H02M 3/158*       (2006.01)
*G01R 19/165*      (2006.01)
(Continued)

(52) U.S. Cl.
CPC ...... *H02M 3/158* (2013.01); *G01R 19/16538* (2013.01); *H02M 1/0009* (2021.05);
(Continued)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS

| 8,587,275 B2 | 11/2013 | Nome Silva et al. |
| 9,502,980 B2 | 11/2016 | Rahimi et al. |

(Continued)

FOREIGN PATENT DOCUMENTS

| GB | 2469370 A | 10/2010 |
| WO | 2017027393 A1 | 2/2017 |
| WO | 2019055891 A1 | 3/2019 |

OTHER PUBLICATIONS

International Search Report and Written Opinion of the International Searching Authority, International Application No. PCT/GB2021/051042, mailed Jul. 26, 2021.

(Continued)

*Primary Examiner* — Jeffrey A Gblende
(74) *Attorney, Agent, or Firm* — Jackson Walker L.L.P.

(57) ABSTRACT

Control circuitry for controlling a current through an inductor of a power converter, the control circuitry comprising: comparison circuitry configured to compare a measurement signal, indicative of a current through the inductor during a charging phase of the power converter, to a signal indicative of a target average current through the inductor for the charging phase and to output a comparison signal based on said comparison; detection circuitry configured to detect, based on the comparison signal, a crossing time indicative of a time at which the current through the inductor during the charging phase is equal to the target average current for the charging phase; and current control circuitry configured to control a current through the inductor during a subsequent charging phase based on the crossing time.

23 Claims, 8 Drawing Sheets

Related U.S. Application Data (60) Provisional application No. 63/058,241, filed on Jul. 29, 2020.

(51) Int. Cl.
  *H02M 1/00*    (2006.01)
  *H02M 3/157*    (2006.01)
  *H03K 3/0233*   (2006.01)
  *H03K 5/24*    (2006.01)

(52) U.S. Cl.
  CPC ........ *H02M 3/157* (2013.01); *H03K 3/02337* (2013.01); *H03K 5/24* (2013.01)

(58) Field of Classification Search
  CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 3/1588; H02M 2003/1566; H02M 3/1582; H02M 3/1584; H02M 2003/1557; H02M 1/0032; H02M 1/4225; H02M 7/217; H05B 39/048; B23K 11/24; H04B 2215/069; G01R 19/265; G01R 19/16504; G01R 19/16519; G01R 19/16523; G01R 19/16533; G01R 19/16538; G01R 19/16542; G01R 19/16547; G01R 19/16552; G01R 19/175

See application file for complete search history.

(56) References Cited

U.S. PATENT DOCUMENTS

| | | |
|---|---|---|
| 2009/0309573 A1 | 12/2009 | Lurkens et al. |
| 2013/0241513 A1 | 9/2013 | Trautmann |
| 2014/0184187 A1 | 7/2014 | Hwang |
| 2014/0247029 A1 | 9/2014 | Krabbenborg |
| 2015/0077074 A1 | 3/2015 | Rahimi et al. |

OTHER PUBLICATIONS

Combined Search and Examination Report under Sections 17 and 18(3), UKIPO, Application No. GB2015631.1, mailed Mar. 29, 2021.

CONTROL CIRCUITRY FOR CONTROLLING A POWER SUPPLY

The present application is a continuation of U.S. Nonprovisional patent application Ser. No. 17/245,188, filed Apr. 30, 2021, which claims priority to U.S. Provisional Patent Application Ser. No. 63/058,241, filed Jul. 29, 2020, and United Kingdom Patent Application No. 2015631.1, filed Oct. 2, 2020, each of which is incorporated by reference herein in its entirety.

TECHNICAL FIELD

The present disclosure relates to circuitry for controlling a power supply, and in particular to circuitry for controlling a current through an inductor of power converter circuitry during a charging phase of the power converter circuitry.

BACKGROUND

Portable electronic devices such as mobile phones, laptop and tablet computers, smartwatches etc. typically include a power source such as an on-board battery to power the various components and subsystems of the portable electronic device.

Some components or subsystems of a portable electronic device may require a supply voltage that is greater than the output voltage of the on-board battery. For example, in order to provide a desired output signal amplitude range for driving an output transducer (e.g. loudspeaker that is used to output sound such as music, speech and the like, a haptic transducer such as a resonant actuator, or an ultrasonic transducer) an amplifier subsystem may require a supply voltage that is greater than the maximum output voltage of the on-board battery.

Thus, a boost converter may be provided in such devices, to convert the output voltage of the on-board battery to a higher voltage that is suitable for use as a supply for such components and subsystems. A boost converter is sometimes referred to as a step-up converter in the art since it "steps up" the source voltage.

Figure 1:
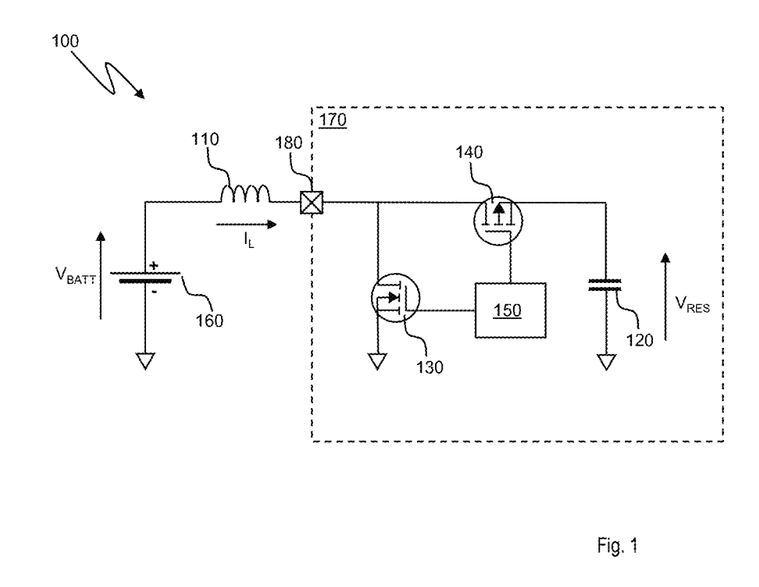
FIG. 1 provides a simplified schematic representation of example boost converter circuitry and a graph illustrating current through an inductor of the boost converter circuitry.

FIG. 1 provides a simplified schematic representation of example boost converter circuitry and a graph illustrating current flowing through an inductor of the boost converter circuitry.

The boost converter circuitry (shown generally at 100 in FIG. 1) essentially includes an inductor (L) 110, a reservoir capacitor 120, a first controllable switch device 130 (which in this example is an n-channel MOSFET), a second controllable switch device 140 (which in this example is a p-channel MOSFET), and control circuitry 150 for controlling the operation of the first and second controllable switch devices (referred to hereinafter simply as switches) 130, 140. The first and second switches 130, 140, the control circuitry 150 and, in some examples, the reservoir capacitor 120 may be provided as part of an integrated circuit (IC) 170, whilst the inductor 110 is external to the IC 170 and is coupled to the IC 170 via a terminal 180 of the IC 170, such as a pin, pad, ball or the like. In other examples the reservoir capacitor 120 may be provided external to the IC 170.

The inductor 110 is coupled in series between a positive terminal of a battery 160 of a host device (e.g. a mobile phone or the like) and a drain terminal of the first switch 130.

A source terminal of the first switch 130 is coupled to a ground or other reference voltage supply rail (hereinafter referred to as ground, for simplicity), and a gate terminal of the first switch 130 is coupled to a first output of the control circuitry 150 so as to receive a control signal from the control circuitry 150.

A source terminal of the second switch 140 is coupled to the inductor 110 and a drain terminal of the second switch 140 is coupled to a first terminal of the reservoir capacitor 120. A gate terminal of the second switch 140 is coupled to a second output of the control circuitry 150 so as to receive a control signal from the control circuitry 150. The second terminal of the reservoir capacitor 120 is coupled to ground.

In operation of the boost converter circuitry 100, the first and second switches 130, 140 are controlled so as to repeatedly couple one terminal of the inductor 110 to ground and then to the reservoir capacitor 120, such that energy can be transferred from the inductor 110 to the reservoir capacitor 120 to increase a voltage $V_{RES}$ across the reservoir capacitor 120 to a level that is greater than an output voltage $V_{BATT}$ of the battery 160.

In a first, charging, phase $\phi_1$ of operation of the circuitry 100, the control circuitry 150 outputs control signals to the first and second switches 130, 140 to switch the first switch 130 on, and to switch the second switch 140 off. Thus, during a first time period between a first time $t_0$ and a second time $t_1$, a current path exists from the battery 160 to ground through the inductor 110, and an increasing current $I_L$ flows through the inductor 110, as shown in the graph of FIG. 1. As a result of the increasing inductor current $I_L$, the inductor stores some energy by generating a magnetic field.

In a second, discharging, phase $\phi_2$, of operation of the circuitry 100, the control circuitry 150 outputs control signals to the first and second switches 130, 140 to switch the first switch 130 off, and to switch the second switch 140 on. Thus, during a second time period between the second time $t_1$ and a third time $t_2$, current can no longer flow through the inductor 110 to ground through the first switch 130. However, a current path from the inductor 110 to ground through the reservoir capacitor 120 now exists. The magnetic field around the inductor 110 collapses, inducing a flow of current which charges the reservoir capacitor 120. Therefore, the two power sources $V_{BATT}$ and the inductor L 110 will be in series, causing a higher voltage to charge the reservoir capacitor 120 through the second switch 140.

By repeating the charging phase $\phi_1$ and the discharging phase $\phi_2$ a number of times, the reservoir capacitor 120 can be charged to a level at which the voltage $V_{RES}$ across the reservoir capacitor 120 is greater than the voltage $V_{BATT}$ output by the battery 160 and is thus suitable for supplying downstream components or subsystems such as amplifier circuitry or the like that require a greater voltage than can be provided by the battery 160 alone.

Typically the operation of the boost converter circuitry 100 is regulated by means of a control loop such that, over a number of charging phases, the average current through the inductor 110 per charging phase $\phi_1$ is equal to, or at least close to, a target average inductor current.

Figure 2:
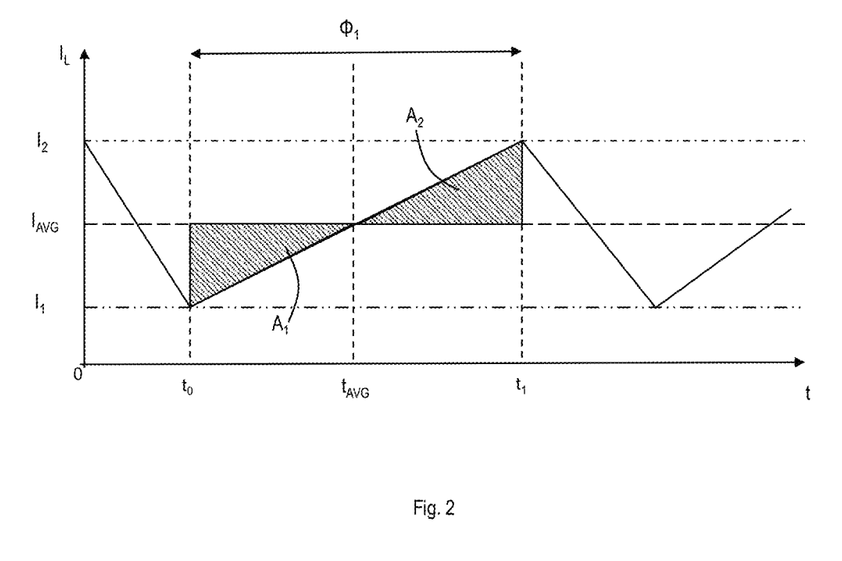
FIG. 2 is a graph illustrating an ideal situation in which the average current through an inductor of the boost converter circuitry of FIG. 1 during a charging phase is equal to a target average current.

FIG. 2 is a graph showing, for illustrative purposes, an ideal situation in which the average current flowing through the inductor 110 during a charging phase $\phi_1$ is equal to a target average current $I_{AVG}$ value.

During the charging phase $\phi_1$, which starts at a time $t_0$ and ends at a time $t_1$, the inductor current $I_L$ rises from a first value $I_1$, which is less than $I_{AVG}$, to a second value $I_2$, which is greater than $I_{AVG}$. In the illustrated example the difference between $I_2$ and $I_{AVG}$ is equal to the difference between $I_{AVG}$ and $I_1$ (i.e. $I_2-I_{AVG}=I_{AVG}-I_1$), but it will be appreciated that this may not necessarily always be the case.

At a time $t_{AVG}$ which, in this example, is halfway between $t_0$ and $t_1$ (i.e. $t_{AVG}=(t_1-t_0)/2$), the instantaneous value of the inductor current $I_L$ is equal to $I_{AVG}$. Thus, the increase in the inductor current $I_L$ from $I_1$ to $I_{AVG}$ between $t_0$ and $t_{AVG}$ is equal to the increase in the inductor current $I_L$ from $I_{AVG}$ to $I_2$ between $t_{AVG}$ and $t_1$, and so in the illustrated example the average inductor current $I_L$ over the charging phase D, is equal to $I_{AVG}$. This is apparent in the graph of FIG. 2, in which the area $A_1$, which is bounded by $I_{AVG}$, to and $t_{AVG}$, is equal to the area A2, which is bounded by $I_{AVG}$, $t_{AVG}$ and $t_2$.

Regulating the inductor current $I_L$ in this way typically involves the use of analogue components such as integrators, which generally occupy a large area of silicon when the boost converter circuitry 100 is implemented in an integrated circuit (IC).

SUMMARY

According to a first aspect, the invention provides control circuitry for controlling a current through an inductor of a power converter, the control circuitry comprising:
  comparison circuitry configured to compare a measurement signal, indicative of a current through the inductor during a charging phase of the power converter, to a signal indicative of a target average current through the inductor for the charging phase and to output a comparison signal based on said comparison;
  detection circuitry configured to detect, based on the comparison signal, a crossing time indicative of a time at which the current through the inductor during the charging phase is equal to the target average current for the charging phase; and
  current control circuitry configured to control a current through the inductor during a subsequent charging phase based on the crossing time.

The control circuitry may further comprise monitoring circuitry configured to monitor a duration of the charging phase.

The monitoring circuitry may be configured to monitor the duration of the charging phase based on an on-time of a switch that controls a flow of current through the inductor.

The monitoring circuitry may comprises a first counter, and the monitoring circuitry may be configured to cause the first counter to commence a first count on detection of a switch control signal that causes the switch to switch on.

The monitoring circuitry may be configured to output a signal indicative of a first count value on detection of a switch control signal that causes the switch to switch off, wherein the first count value is indicative of the duration of the charging phase.

The detection circuitry may be configured to determine a second count value from the first counter based on the comparison signal, wherein the second count value is indicative of the crossing time.

The detection circuitry may be configured to determine the second count value in response to detection of a change in the comparison signal indicative that the current through the inductor is equal to the target average current.

The detection circuitry may comprise a second counter configured to generate a second count value indicative of the crossing time.

The detection circuitry may be configured to trigger the second counter to commence a second count on detection of a switch control signal that causes the switch to switch on.

The detection circuitry may be configured to trigger the second counter to commence a second count on detection of a change in the comparison signal indicative of the beginning of the charging phase.

The first counter and the second counter may be synchronised to a common clock signal.

The control circuitry may further comprise digital comparison circuitry configured to compare a signal representative of the first count value to a signal representative of the second count value and to output a control signal to the current control circuitry based on the comparison, wherein the current control circuitry is configured to control the current through the inductor based on the control signal.

The signal representative of the first count value may be a signal indicative of half of the first count value.

The current control circuitry may be configured to control the current through inductor in the subsequent charging phase so as to compensate, at least partially, for any difference between the current through the inductor during the charging phase and the target average current for the charging phase.

The current control circuitry may be configured to increase the current through the inductor in the subsequent charging phase in response to the control signal being indicative that the crossing time is greater than half the duration of the charging phase.

The current control circuitry may be configured to reduce the current through the inductor in the subsequent charging phase in response to the control signal being indicative that the crossing time is less than half the duration of the charging phase.

The comparison circuitry may comprise:
  differential amplifier circuitry configured to output a signal indicative of a difference between the measurement signal and a signal representative of the target average current; and
  comparator circuitry configured to output the comparison signal based on the signal output by the differential amplifier circuitry.

The comparator circuitry may comprise hysteretic comparator circuitry.

The comparison circuitry may comprise analogue circuitry and the detection circuitry may comprise digital circuitry.

The control circuitry may be implemented as an integrated circuit.

According to a second aspect of the invention there is provided an electronic device comprising control circuitry according to any preceding claim.

According to a third aspect of the invention there is provided circuitry for estimating whether an average current through an inductor of a power converter over a charging phase of the power converter corresponds to a target average current value for the charging phase, the circuitry comprising:
  comparison circuitry configured to compare a signal indicative of current through the inductor during the charging phase to a signal indicative of the target average current value; and
  detection circuitry configured to detect, based on a control signal output by the comparison circuitry, a time at which the current through the inductor is equal to the target average current value,
  wherein the circuitry is configured to output an indication of whether the current through the inductor corresponds to the target average current value based on the time at which the current through the inductor is equal to the target average current value.

According to a fourth aspect of the invention there is provided circuitry for monitoring a current through an inductor of a power converter during a charging phase of the power converter, the circuitry comprising:

a first counter configured to count a first number of clock cycles indicative of a total period of the charging phase;

a second counter configured to count a second number of clock cycles indicative of a period from a start of the charging phase to a threshold time at which a current of the inductor is equal to a target average current of the inductor during the charging phase; and comparison circuitry configured to compare the first number of clock cycles and the second number of clock cycles and to output a comparison signal indicative of whether the current through the inductor corresponds to the target average current, based on the comparison of the first number of clock cycles and the second number of clock cycles.

According to a fifth aspect of the invention there is provided circuitry for estimating whether an average current through an inductor of a power converter over a charging phase of the power converter corresponds to a target average current value based on a comparison of the time at which the current through the inductor is equal to a target average current value.

According to a sixth aspect of the invention there is provided a power converter comprising circuitry for estimating whether an average current through an inductor of the power converter over a charging phase corresponds to a target average current value based on a comparison of the time at which the current through the inductor is equal to a target average current value.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 3:
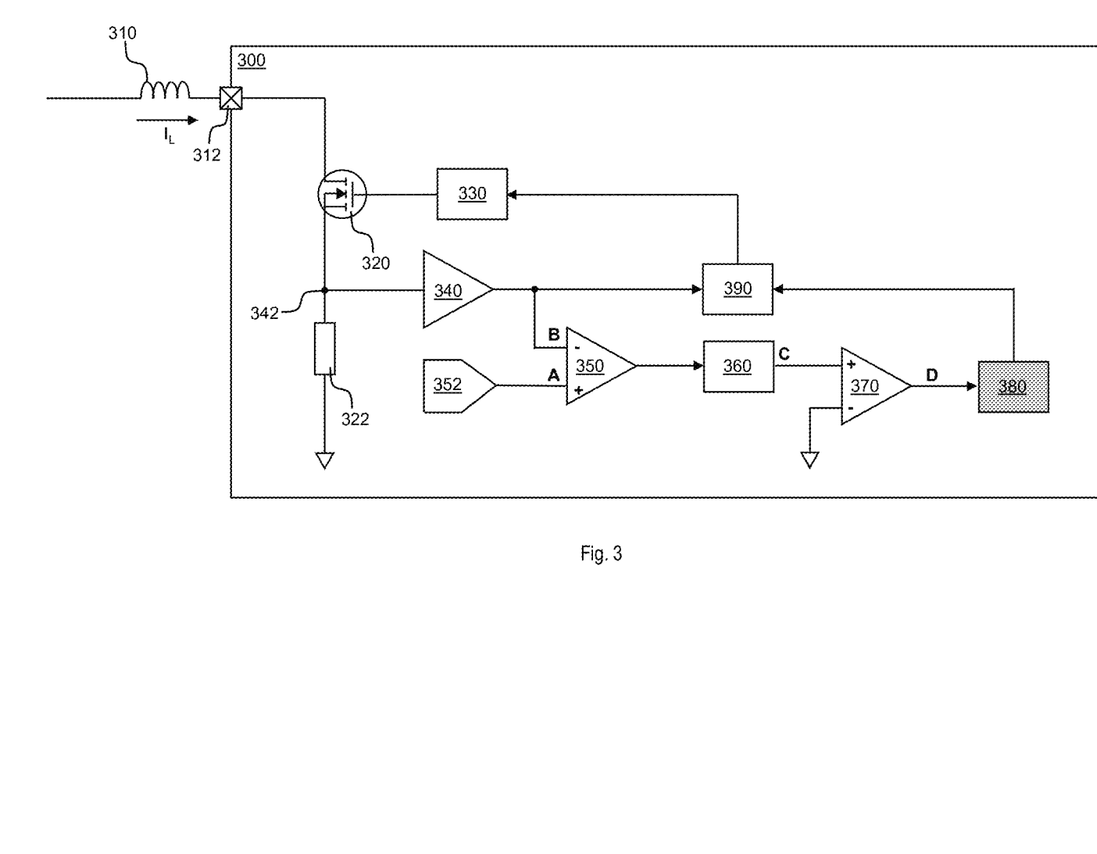
FIG. 3 illustrates an example of control circuitry for controlling current through an inductor of power supply circuitry.

FIG. 3 illustrates control circuitry 300 for controlling current through an inductor 310 of power supply circuitry (e.g. boost converter circuitry of the kind described above with reference to FIG. 1) during a charging phase thereof.

The control circuitry 300 comprises a controllable switch device 320 (hereinafter referred to as switch 320) which, in this example, is an n-channel MOSFET device. A drain terminal of the switch 320 is coupled to the inductor 310 (via an IC terminal 312 such as a pin, pad, ball or the like). A source terminal of the switch 320 is coupled to a ground or other reference voltage supply rail (hereinafter referred to as ground, for simplicity) via a sense resistance 322, and a gate terminal of the switch 320 is coupled to an output of gate driver circuitry 330 so as to receive a control signal from the gate driver circuitry 330.

A buffer amplifier 340 is coupled to a node 342 intermediate the source terminal of the first switch 320 and the sense resistance 322, and is operative to output a voltage indicative of a current $I_L$ through the inductor 310. This sensed voltage (also referred to as a measurement signal) is denoted by the letter B in FIGS. 3 and 4*a-4c*.

An output of the buffer amplifier 340 is coupled to a first, inverting (−), input of differential amplifier circuitry 350. A second, non-inverting input (+) of the differential amplifier circuitry 350 is coupled to digital-to-analogue converter (DAC) circuitry 352, which provides a voltage (labelled A in FIGS. 3 and 4*a-4c*) indicative of a target average current $I_{AVG}$ through the inductor 310 per charging phase 4, of the power supply circuitry.

The differential amplifier circuitry 350 is thus configured to output a signal indicative of a difference between the current $I_L$ through the inductor 310 and the target average current $I_{AVG}$.

An output of the differential amplifier circuitry 350 is coupled to an input of analogue integrator circuitry 360. The analogue integrator circuitry 360 is configured to integrate the signal received from the differential amplifier circuitry 350.

An output of the analogue integrator circuitry 360 is coupled to a first, non-inverting (+) input of comparator circuitry 370. A signal C output by the analogue integrator circuitry 360 is therefore received at the first input of the comparator circuitry 370. A second, inverting (−) input of the comparator circuitry 370 is coupled to ground (or some other suitable reference voltage source).

An output of the comparator circuitry 370 is coupled to an input of a digital control loop 380 such that a signal D output by the comparator circuitry 370 is received at the input of the digital control loop 380. An output of the digital control loop is coupled to a first input of peak current control circuitry 390. A second input of the peak current control circuitry 390 is coupled to the output of the buffer amplifier circuitry 340, so as to receive the signal indicative of the current $I_L$ through the inductor 310. An output of the peak current control circuitry 390 is coupled to an input of the gate drive circuitry 330, so as to provide a control signal to the gate drive circuitry 330, based on the output of the digital control loop 380 and on the signal indicative of the current $I_L$ through the inductor 310.

In operation of the control circuitry 300 the switch 320 controls the current $I_L$ through the inductor 310, in accordance with control signals received from the gate drive circuitry 330.

The inductor 310 receives a supply voltage from a source such as an on-board battery (not shown) of a host device (e.g. a mobile phone or the like) incorporating the control circuitry 300.

During a charging phase of operation, the switch 320 is switched on, thus establishing a current path to ground through the inductor 310 and the sense resistance 322. Current $I_L$ through the inductor 310 thus increases and a magnetic field thus develops around the inductor 310, storing energy.

The buffer amplifier circuitry 340 outputs a voltage indicative of the inductor current $I_L$ (the measurement signal B) to the inverting input of the differential amplifier circuitry 350, which in turn outputs a voltage representing the difference between the inductor current $I_L$ and the target average current $I_{AVG}$ to the analogue integrator circuitry 360.

If the level of the signal C output by the analogue integrator circuitry 370 is greater than 0 volts, a comparison signal D output by the comparator circuitry 370 is at a logic high level. When the level of the signal C reaches 0 volts (or some threshold voltage that is slightly higher than 0 volts) the comparison signal D output by the comparator circuitry 370 changes to a logic low level (0 volts or close to 0 volts).

If the comparison signal D remains at a logic high level for the duration of a charging phase and switches to a logic low level at the end of the charging phase, this is indicative that the average inductor current $I_L$ during the charging phase was equal to the target average inductor current $I_{AVG}$, and the digital control loop 380 may output no signal, or may output a signal to the peak current control circuitry 390 indicating that no change to the inductor current $I_L$ is required for a subsequent charging phase (e.g. the next charging phase) in order to meet the target average current $I_{AVG}$.

If the comparison signal D remains at a logic high level beyond the end of a charging phase, this is indicative that the average inductor current $I_L$ during the charging phase was lower than the target average inductor current $I_{AVG}$, and the digital control loop 380 outputs a signal to the peak current control circuitry 390 indicating that the average inductor current $I_L$ should be increased in a subsequent charging phase (e.g. the next charging phase) to compensate, at least partially, for the difference between the inductor current during the charging phase and the target average inductor current $I_{AVG}$. In response to this signal, the peak current control circuitry 390 determines a difference between the inductor current $I_L$ as detected during the charging phase (based on the measurement signal B output by the buffer amplifier circuitry 340) and a required inductor current $I_L$ for the subsequent charging phase (based on the signal received from the digital control loop 380), and outputs an appropriate control signal to the gate driver circuitry 330. The gate driver circuitry 330 in turn increases the duty cycle of the switch 320 to increase the on-time of the switch 320 for the subsequent charging phase, thereby increasing the inductor current $I_L$ in the subsequent charging phase.

In contrast, if the comparison signal D switches to a logic low level before the end of a charging phase, this is indicative that the average inductor current $I_L$ during the charging phase was higher than the target average inductor current $I_{AVG}$, and the digital control loop 380 outputs a signal to the peak current control circuitry 390 indicating that the average inductor current $I_L$ should be reduced in the subsequent charging phase to compensate, at least partially, for the difference between the inductor current during the charging phase and the target average inductor current $I_{AVG}$. In response to this signal, the peak current control circuitry 390 determines a difference between the inductor current $I_L$ as detected during the charging phase (based on the measurement signal B output by the buffer amplifier circuitry 340) and a required inductor current $I_L$ for the subsequent charging phase (based on the signal received from the digital control loop 380), and outputs an appropriate control signal to the gate driver circuitry 330. The gate driver circuitry 330 in turn reduces the duty cycle of the switch 320 to reduce the on-time of the switch 320 for the subsequent charging phase, thereby reducing the inductor current $I_L$.

Figure 4A:
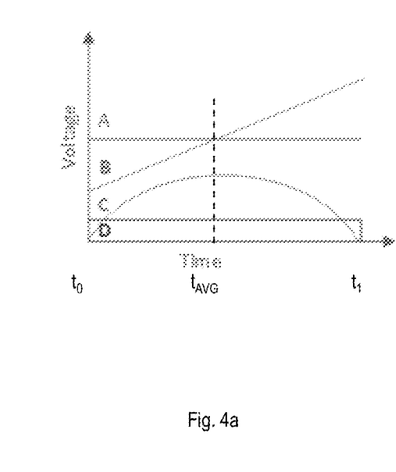
FIGS. 4*a-c* illustrate example waveforms of signals present in the circuitry of FIG. 3 during a charging phase.

FIG. 4a illustrates the signals A-D when the average inductor current $I_L$ is equal to the target average current $I_{AVG}$. A charging phase begins at a time $t_0$ and ends at a time $t_1$. At $t_0$ the current $I_L$ through the inductor 310 begins to increase, causing the voltage output by the buffer amplifier circuitry 340 (measurement signal B) to increase accordingly. The amplitude of signal C, which represents the integral of the difference between the signal A (the voltage representing the target average current $I_{AVG}$) and the measurement signal B, also begins to increase at time $t_0$, since the difference between signal A and signal B is positive.

At a time $t_{AVG}$, the voltage output by the buffer amplifier circuitry 340 (measurement signal B) is equal to the voltage (signal A) representing the target average current $I_{AVG}$. After this point the difference between signal A and signal B becomes increasingly negative, and the amplitude of signal C decreases accordingly.

While the amplitude of signal C is positive, the comparison signal D output by the comparator circuitry 370 to the digital control loop 380 is at a logic high level. At time $t_1$ (the end of the charging phase) the amplitude of the signal C drops to 0 and comparison signal D changes to a logic low level. Because the comparison signal D has remained at a logic high level for the duration of the charging phase but has dropped to a logic low level at the end of the charging phase, no action need be taken by the digital control loop 380 to adjust the inductor current $I_L$ in a subsequent charging phase.

Figure 4B:
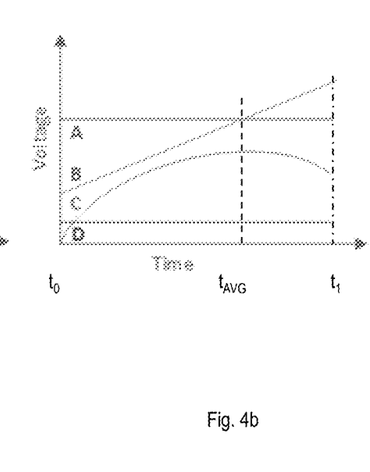

FIG. 4b illustrates the signals A-D when the average inductor current $I_L$ is lower than the target average current $I_{AVG}$. Again, a charging phase begins at a time $t_0$ and ends at a time $t_1$. At $t_0$ the current $I_L$ through the inductor 310 begins to increase, causing the voltage output by the buffer amplifier circuitry 340 (measurement signal B) to increase accordingly. The amplitude of signal C, which represents the integral of the difference between the signal A (the voltage representing the target average current $I_{AVG}$) and the measurement signal B, also begins to increase at time $t_0$, since the difference between signal A and signal B is positive.

At a time $t_{AVG}$, the voltage output by the buffer amplifier circuitry 340 (measurement signal B) is equal to the voltage (signal A) representing the target average current $I_{AVG}$. After this point the difference between signal A and signal B becomes increasingly negative, and the amplitude of signal C decreases accordingly.

In contrast to the situation illustrated in FIG. 4a, in FIG. 4b the comparison signal D is still at a logic high level at the end of the charging phase ($t_1$), because the level of the signal C has not yet fallen to 0. This is because it has taken longer for the level of signal B to reach the level of signal A than in the situation illustrated in FIG. 4a, indicating that the average inductor current $I_L$ over the charging phase is lower than the target average inductor current $I_{AVG}$, and thus that the inductor current $I_L$ should be increased in a subsequent charging phase.

Figure 4C:
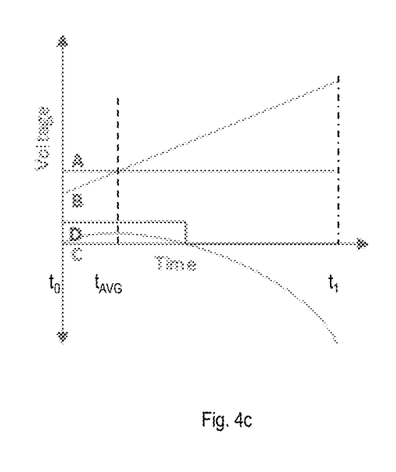

FIG. 4c illustrates the signals A-D when the average inductor current $I_L$ is greater than the target average current $I_{AVG}$. Again, a charging phase begins at a time $t_0$ and ends at a time $t_1$. At $t_0$ the current $I_L$ through the inductor 310 begins to increase, causing the voltage output by the buffer amplifier circuitry 340 (measurement signal B) to increase accordingly. The amplitude of signal C, which represents the integral of the difference between the signal A (the voltage representing the target average current $I_{AVG}$) and the measurement signal B, also begins to increase at time $t_0$, since the difference between signal A and signal B is positive.

At a time $t_{AVG}$, the voltage output by the buffer amplifier circuitry 340 (measurement signal B) is equal to the voltage (signal A) representing the target average current $I_{AVG}$. After this point the difference between signal A and signal B becomes increasingly negative, and the amplitude of signal C decreases accordingly.

In contrast to the situation illustrated in FIG. 4a, in FIG. 4c the comparison signal D switches to a logic low level before the end of the charging phase, because the level of the signal C falls to 0 before the end of the charging phase. This is because it has taken less time for the level of signal B to reach the level of signal A than in the situation illustrated in FIG. 4a, indicating that the average inductor current $I_L$ over the charging phase is greater than the target average inductor current $I_{AVG}$, and thus that the inductor current $I_L$ should be reduced in a subsequent charging phase.

The circuitry 300 therefore provides a scheme to regulate the current $I_L$ through the inductor 310 about a target average current $I_{AVG}$ during a charging phase of a power supply circuitry. However, as will be apparent from FIG. 3 and the discussion above, the control circuitry 300 includes a significant amount of analogue circuitry (indeed, the only digital circuitry is the digital control loop 380, as represented by the shading of box 380 in FIG. 3) and thus may occupy a relatively large area of silicon when implemented in an integrated circuit. For example, the analogue integrator circuitry alone may occupy an area of greater than 0.1 mm².

Embodiments of the present disclosure provide control circuitry for controlling a current through an inductor of power supply circuitry during a charging phase of the power supply circuitry, in which the control circuitry includes less analogue circuitry than the control circuitry 300 described above with reference to FIG. 3, and thus may occupy less silicon area when implemented in integrated circuitry which has a direct impact on the number of die (IC's) that can be manufactured on any given wafer, i.e. the smaller the die size for a given wafer diameter the greater the number of die that can be obtained, and the cost of production per die.

Embodiments of the present disclosure are based on the premise that the inductor current $I_L$ is approximately linear over a charging phase. Assuming that the current $I_L$ through the inductor is linear during the charging phase, then for an ideal charging phase in which the average current through the inductor is equal to the target average current, the instantaneous inductor current $I_L$ will be equal to the target average current exactly halfway through the charging phase, as discussed above with reference to FIG. 2.

The control circuitry of the present disclosure thus effectively determines a time period from the beginning of the charging phase to a crossing time at which the current through the inductor is equal to the target average current and compares this time period to the total period of the charging phase.

In an ideal charging phase in which the average inductor current $I_L$ over the charging phase is equal to the target average current $I_{AVG}$, the period from the beginning of the charging phase to the crossing time should be equal to half the total duration or period of the charging phase, because of the assumed linearity of the inductor current.

Thus, if the period from the beginning of the charging phase to the crossing time is not equal to half the total duration of the charging phase, this is indicative that the average inductor current in that charging phase is not equal to the target average inductor current, and thus compensating action is required in a subsequent charging phase to compensate, at least partially, for the difference between the actual inductor current and the target average inductor current. The control circuitry therefore controls the inductor current $I_L$ in one or more subsequent charging phases (e.g. increases or decreases the inductor current $I_L$), based on time, such that over a plurality of charging phases, the average current $I_L$ through the inductor per charging phase is equal to the target average current $I_{AVG}$.

Figure 5A:
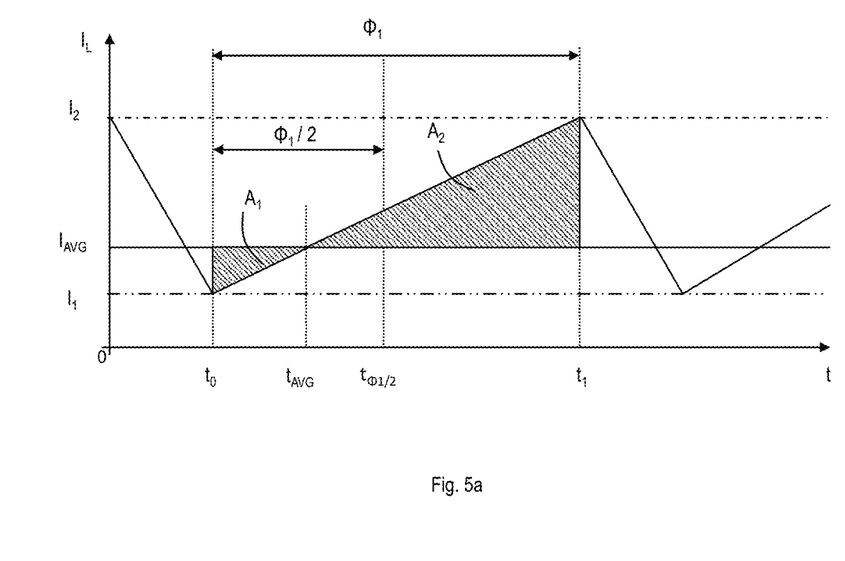
FIGS. 5*a-b* illustrate example waveforms showing an approximation of a current through an inductor of power supply circuitry during a charging phase of the power supply.

FIG. 5a is a graph showing, for illustrative purposes, a situation in which the average current $I_L$ through an inductor of power supply circuitry during a charging phase $\phi_1$ is greater than a target average current $I_{AVG}$.

In this example, the inductor current $I_L$ reaches the target average current $I_{AVG}$ at a time $t_{AVG}$, before half the total period of the charging phase $\phi_1$ has elapsed, i.e. $t_{AVG}-t_0<t\phi_1/2$. Based on this condition, control circuitry according to an embodiment may determine that the average current through the inductor over a whole charging phase is greater than the target average current $I_{AVG}$. The control circuitry may thus control one or more subsequent charging phase(s) such that over a plurality of charging phases the inductor current per charging phase is equal to the target average charging current $I_{AVG}$.

Figure 5B:
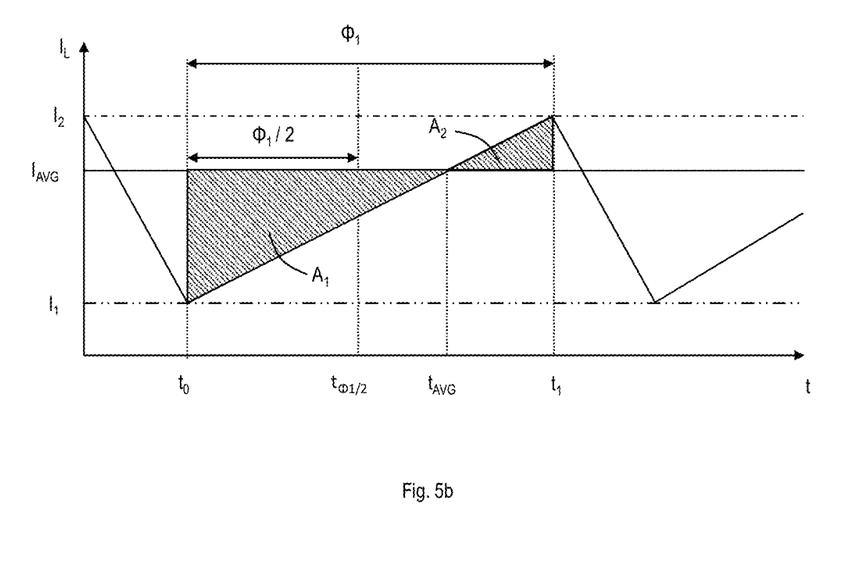

FIG. 5b is a graph showing, for illustrative purposes, a situation in which the average current $I_L$ through an inductor of power supply circuitry during a charging phase $\phi_1$ is greater than a target average current $I_{AVG}$.

In this example, the inductor current $I_L$ reaches the target average current $I_{AVG}$ at a time $t_{AVG}$ after half the total period of the charging phase $\phi_1$ has elapsed, i.e. $t_{AVG}-t_0>t_{\phi1/2}$. Based on this condition, control circuitry according to an embodiment may determine that the average current through the inductor over a whole charging phase is lower than the target average current $I_{AVG}$. The control circuitry may thus control one or more subsequent charging phase(s) such that over a plurality of charging phases the average inductor current per charging phase is equal to the target average inductor current $I_{AVG}$.

Figure 6:
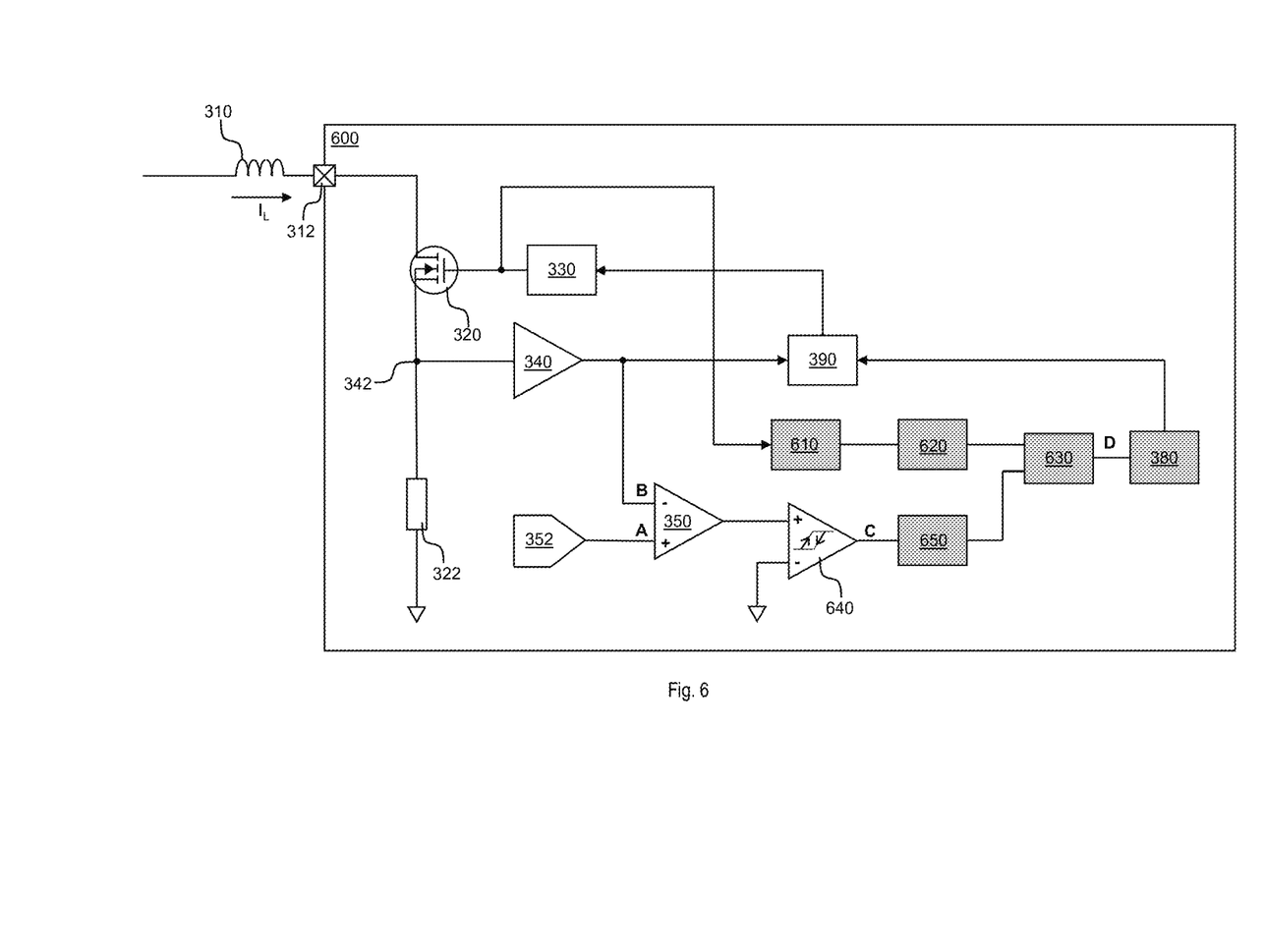
FIG. 6 illustrates an example embodiment of control circuitry for controlling a current through an inductor of power supply circuitry.

FIG. 6 illustrates control circuitry 600 for controlling a current through an inductor of power supply circuitry during a charging phase of the power supply circuitry, according to an embodiment. The control circuitry 600 includes a number of elements in common with the control circuitry 300 described above with reference to FIG. 3. Such common elements are denoted by common reference numerals and will not be described in detail here, for the sake of clarity and brevity.

The control circuitry 600 comprises monitoring circuitry 610 which is configured to detect a duration or period of the charging phase $\phi_1$ of the inductor 310. The monitoring circuitry 610 may comprise a first digital counter, for example.

An input of the monitoring circuitry 610 is coupled to the output of the gate drive circuitry 330. The monitoring circuitry 610 is configured to detect the beginning of the charging phase $\phi_1$, e.g. by detecting a gate drive signal (e.g. a positive voltage) that switches the switch 320 on, and to commence a first count on detection of the beginning of the charging phase $\phi_1$. The monitoring circuitry 610 is further configured to detect the end of the charging phase $\phi_1$, e.g. by detecting a gate drive signal (e.g. 0 volts) that switches the switch 320 off, and to stop the first count on detection of the end of the charging phase $\phi_1$. Thus the monitoring circuitry 610 is configured to detect the on-time of the switch 320 for the charging phase $\phi_1$, and the first count is representative of the duration or period of the charging phase $\phi_1$.

The monitoring circuitry 610 outputs a signal indicative of the value of the first count to a digital divider 620, which determines a divided first count value, by dividing the value of the first count by two, and outputs a signal indicative of the divided first count value to a first input of digital comparison circuitry 630.

The circuitry 600 further comprises hysteretic comparator circuitry 640 configured to receive, at a first, non-inverting (+), input thereof, a signal output by the differential amplifier 350. It will be recalled that the differential amplifier 350 is configured to output a voltage indicative of the difference between the target average inductor current $I_{AVG}$ and the inductor current $I_L$.

A second, inverting (−), input of the hysteretic comparator circuitry 640 is coupled to ground (or some other suitable reference voltage source). The hysteretic comparator circuitry 640 in this example is thus configured to output a comparison signal C indicative of whether the difference between the inductor current $I_L$ and the target average inductor current $I_{AVG}$ is greater than zero.

When the difference between the target average inductor current $I_{AVG}$ and the inductor current $I_L$ is greater than zero (i.e. when the inductor current $I_L$ is less than the target average inductor current $I_{AVG}$), the signal output by the differential amplifier circuitry 350 is positive, and thus the comparison signal C output by the hysteretic comparator circuitry 640 is high.

When the difference between the target average inductor current $I_{AVG}$ and the inductor current $I_L$ reaches zero (i.e. when the inductor current $I_L$ is equal to the target average inductor current $I_{AVG}$), the signal output by the differential amplifier circuitry 350 becomes negative, and thus the comparison signal C output by the hysteretic comparator circuitry 640 goes low.

As will be appreciated by those of ordinary skill in the art, the hysteretic comparator circuitry 640 provides hysteresis, which reduces the risk that the comparison signal C output by the hysteretic comparator circuitry 640 will change incorrectly as a result of transients in the signal output by the differential amplifier circuitry 350.

An output of the hysteretic comparator circuitry 640 is coupled to an input of detection circuitry 650, which is configured to detect, based on the comparison signal C, a time at which the instantaneous current $I_L$ through the inductor 310 is equal to the target average current $I_{AVG}$.

When the inductor current $I_L$ reaches the target average inductor current $I_{AVG}$, the comparison signal C goes low, and the detection circuitry 650 determines the value of the first count at this point in time (referred to hereinafter as the second count value) from the first digital counter. As will be appreciated, this second count value is representative of the amount of time taken for the inductor current $I_L$ to reach the target average inductor current $I_{AVG}$. The detection circuitry 650 outputs a signal indicative of the second count value to a second input of the digital comparison circuitry 630.

The digital comparison circuitry 630 compares the second count value received from the detection circuitry 650 to the divided first count value received from the digital divider circuitry 620, and outputs a signal to the digital control loop 380 based on the comparison.

If the second count value is equal to the divided first count value, i.e. if the time taken for the inductor current $I_L$ to reach the target average inductor value $I_{AVG}$ is exactly half of the duration of the charging phase $\phi_1$, this is indicative that the average inductor current $I_L$ during the charging phase was equal to the target average inductor current $I_{AVG}$, and the digital comparison circuitry 630 may output a signal to the digital control loop 380 indicating that no change to the inductor current $I_L$ is required for a subsequent charging phase. The digital control loop 380 may in turn output no signal, or may output a signal to the peak current control circuitry 390 indicating that no change to the inductor current $I_L$ is required for the subsequent charging phase, as described above with reference to FIG. 3.

If the second count value is greater than divided first count value, i.e. if the time taken for the inductor current $I_L$ to reach the target average inductor value $I_{AVG}$ is greater than half of the period of the charging phase $\phi_1$, this is indicative that the average inductor current $I_L$ during the charging phase was less than the target average inductor current $I_{AVG}$, and the digital comparison circuitry 630 may output a signal to the digital control loop 380 indicating that the inductor current $I_L$ should be increased for a subsequent charging phase. The digital control loop 380 may in turn output a signal to the peak current control circuitry 390 indicating that the inductor current $I_L$ should be increased for the subsequent charging phase, as described above with reference to FIG. 3.

If the second count value is less than the divided first count value, i.e. if the time taken for the inductor current $I_L$ to reach the target average inductor value $I_{AVG}$ is less than half of the period of the charging phase $\phi_1$, this is indicative that the average inductor current $I_L$ during the charging phase was greater than the target average inductor current $I_{AVG}$, and the digital comparison circuitry 630 may output a signal to the digital control loop indicating that the inductor current $I_L$ should be reduced for a subsequent charging phase. The digital control loop 380 may in turn output a signal to the peak current control circuitry 390 indicating that the inductor current $I_L$ should be reduced for the subsequent charging phase, as described above with reference to FIG. 3.

Figure 7A:
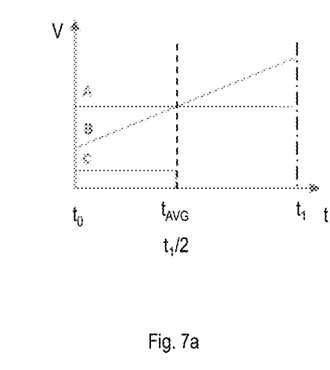
FIGS. 7*a-c* illustrate example waveforms of signals present in the circuitry of FIG. 6 during a charging phase.

FIG. 7a illustrates the signals A-C when the average inductor current $I_L$ is equal to the target average current $I_{AVG}$. A charging phase begins at a time $t_0$ and ends at a time $t_1$. At $t_0$ the current $I_L$ through the inductor 310 begins to increase, causing the voltage output by the buffer amplifier circuitry 340 (measurement signal B) to increase accordingly. Comparison signal C is initially high, since the difference between signal A and signal B is positive.

At a time $t_{AVG}$, the voltage output by the buffer amplifier circuitry 340 (measurement signal B) is equal to the voltage (signal A) representing the target average current $I_{AVG}$. At this point the comparison signal C goes low and the second count value is determined. In this example $t_{AVG}$ is exactly halfway between $t_0$ and $t_1$, meaning that the inductor current $I_L$ during the charging phase is equal to the target average inductor current $I_{AVG}$ (based on the assumption that the inductor current $I_L$ increases linearly during the charging phase) and no action is required to adjust the inductor current $I_L$ in a subsequent charging phase. The second count value is thus equal to the divided first count value, and the digital comparison circuitry 630 thus outputs an appropriate signal to the digital control loop 380.

Figure 7B:
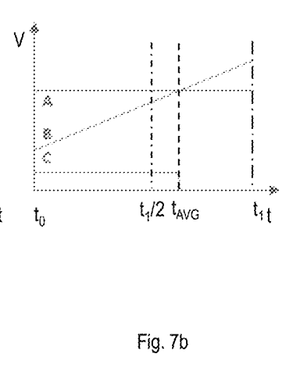

FIG. 7b illustrates the signals A-C when the average inductor current $I_L$ is lower than the target average current $I_{AVG}$. Again, a charging phase begins at a time $t_0$ and ends at a time $t_1$. At $t_0$ the current $I_L$ through the inductor 310 begins to increase, causing the voltage output by the buffer amplifier circuitry 340 (measurement signal B) to increase accordingly. Comparison signal C is initially high, since the difference between signal A and signal B is positive.

At a time $t_{AVG}$, the voltage output by the buffer amplifier circuitry 340 (measurement signal B) is equal to the voltage (signal A) representing the target average current $I_{AVG}$. At this point the comparison signal C goes low, and the second count value is determined.

In contrast to the situation illustrated in FIG. 7a, in FIG. 7b the comparison signal C goes low at a point later than halfway through the charging phase. This is because it has taken longer for the level of the measurement signal B to reach the level of signal A than in the situation illustrated in FIG. 7a, indicating that the average inductor current $I_L$ over the charging phase is lower than the target average inductor current $I_{AVG}$, and thus that the inductor current should be increased in a subsequent charging phase. The second count value is thus less than the divided first count value, and the digital comparison circuitry 630 outputs an appropriate signal to the digital control loop 380, which in turn outputs a signal to the control circuitry 390 to cause the inductor current $I_L$ to be increased for a subsequent charging phase.

Figure 7C:
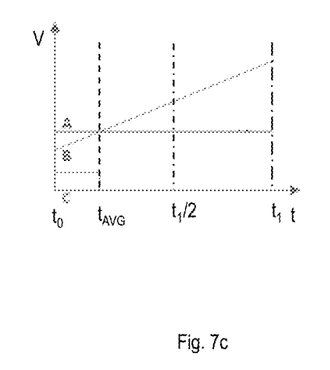

FIG. 7c illustrates the signals A-C when the average inductor current $I_L$ is higher than the target average current $I_{AVG}$. Again, a charging phase begins at a time $t_0$ and ends at a time $t_1$. At $t_0$ the current $I_L$ through the inductor 310 begins to increase, causing the voltage output by the buffer amplifier circuitry 340 (measurement signal B) to increase accordingly. Comparison signal C is initially high, since the difference between signal A and signal B is positive.

At a time $t_{AVG}$, the voltage output by the buffer amplifier circuitry 340 (measurement signal B) is equal to the voltage (signal A) representing the target average current $I_{AVG}$. At this point the comparison signal C goes low, and the second count value is determined.

In contrast to the situation illustrated in FIG. 7a, in FIG. 7c the comparison signal C goes low at a point earlier than halfway through the charging phase. This is because it has taken less time for the level of the measurement signal B to reach the level of signal A than in the situation illustrated in FIG. 7a, indicating that the average inductor current $I_L$ over the charging phase is greater than the target average inductor current $I_{AVG}$, and thus that the inductor current should be reduced in a subsequent charging phase. The second count value is thus greater than the divided first count value, and the digital comparison circuitry 630 outputs an appropriate signal to the digital control loop 380, which in turn outputs a signal to the control circuitry 390 to cause the inductor current $I_L$ to be reduced for a subsequent charging phase.

In an alternative embodiment the detection circuitry 650 may comprise a second digital counter. In this embodiment the first and second digital counters are synchronised to a common clock signal such that they count at the same rate. In this embodiment the detection circuitry 650 detects the beginning of the charging phase $\phi_1$, e.g. by detecting that the comparison signal C has changed from low to high, or by detecting a gate drive signal (e.g. a positive voltage) that switches the switch 320 on. On detection of the beginning of the charging phase the detection circuitry 650 triggers the second digital counter to commence a second count. When the comparison signal C goes low as a result of the inductor current $I_L$ reaching the target average inductor current $I_{AVG}$ the detection circuitry 650 stops the second count, and outputs a signal indicative of the second count value to the second input of the digital comparison circuitry 630, which compares the second count value to the divided first count value as described above.

Embodiments of the present disclosure thus provide circuitry for controlling inductor current during a charging phase of power supply circuitry in order to meet a target average current based on time. The circuitry 600 uses less analogue circuitry than the circuitry 300 illustrated in FIG. 3, effectively replacing the analogue integrator circuitry 360 and the analogue comparator circuitry 370 with smaller digital circuitry (the digital monitoring circuitry 610, digital divider circuitry 620, digital comparison circuitry 630 and digital detection circuitry 650, as represented in FIG. 6 by the shaded boxes). Thus, when implemented as an integrated circuit the control circuitry 600 occupies less silicon area than the circuitry 300 of FIG. 3. Additionally, the use of digital circuitry instead of analogue circuitry may reduce the power consumption of the circuitry 600, in comparison to the circuitry 300 of FIG. 3.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Control circuitry for controlling a current through an inductor of a power converter, the control circuitry comprising:
   comparison circuitry configured to compare a measurement signal, indicative of a current through the inductor during a first phase of operation of the power converter, to a signal indicative of a target average current through the inductor for the first phase and to output a comparison signal based on said comparison;
   detection circuitry configured to detect, based on the comparison signal, a crossing time indicative of a time at which the current through the inductor during the first phase is equal to the target average current for the first phase; and
   current control circuitry configured to control a current through the inductor during a subsequent first phase based on the crossing time.

2. Control circuitry according to claim 1, further comprising monitoring circuitry configured to monitor a duration of the first phase.

3. Control circuitry according to claim 2, wherein the monitoring circuitry is configured to monitor the duration of the first phase based on an on-time of a switch that controls a flow of current through the inductor.

4. Control circuitry according to claim 3, wherein the monitoring circuitry comprises a first counter, and wherein the monitoring circuitry is configured to cause the first counter to commence a first count on detection of a switch control signal that causes the switch to switch on.

5. Control circuitry according to claim 4, wherein the monitoring circuitry is configured to output a signal indicative of a first count value on detection of a switch control signal that causes the switch to switch off, wherein the first count value is indicative of the duration of the first phase.

6. Control circuitry according to claim 4, wherein the detection circuitry is configured to determine a second count value from the first counter based on the comparison signal, wherein the second count value is indicative of the crossing time.

7. Control circuitry according to claim 6, wherein the detection circuitry is configured to determine the second count value in response to detection of a change in the comparison signal indicative that the current through the inductor is equal to the target average current.

8. Control circuitry according to claim 4, wherein the detection circuitry comprises a second counter configured to generate a second count value indicative of the crossing time.

9. Control circuitry according to claim 8, wherein the detection circuitry is configured to trigger the second counter to commence a second count on detection of a switch control signal that causes the switch to switch on.

10. Control circuitry according to claim 8, wherein the detection circuitry is configured to trigger the second counter to commence a second count on detection of a change in the comparison signal indicative of the beginning of the first phase.

11. Control circuitry according to claim 8, wherein the first counter and the second counter are synchronised to a common clock signal.

12. Control circuitry according to claim 6, further comprising digital comparison circuitry configured to compare a signal representative of the first count value to a signal representative of the second count value and to output a control signal to the current control circuitry based on the comparison, wherein the current control circuitry is configured to control the current through the inductor based on the control signal.

13. Control circuitry according to claim 12, wherein the signal representative of the first count value is a signal indicative of half of the first count value.

14. Control circuitry according to claim 1, wherein the current control circuitry is configured to control the current through inductor in the subsequent first phase so as to compensate, at least partially, for any difference between the current through the inductor during the first phase and the target average current for the first phase.

15. Control circuitry according to claim 14, wherein the current control circuitry is configured to increase the current through the inductor in the subsequent first phase in response to the control signal being indicative that the crossing time is greater than half the duration of the first phase.

16. Control circuitry according to claim 14, wherein the current control circuitry is configured to reduce the current through the inductor in the subsequent first phase in response to the control signal being indicative that the crossing time is less than half the duration of the first phase.

17. Control circuitry according to claim 1, wherein the comparison circuitry comprises:
differential amplifier circuitry configured to output a signal indicative of a difference between the measurement signal and a signal representative of the target average current; and
comparator circuitry configured to output the comparison signal based on the signal output by the differential amplifier circuitry.

18. Control circuitry according to claim 16, wherein the comparator circuitry comprises hysteretic comparator circuitry.

19. Control circuitry according to claim 1, wherein comparison circuitry comprises analogue circuitry and the detection circuitry comprises digital circuitry.

20. Control circuitry according to claim 1 implemented as an integrated circuit.

21. An electronic device comprising control circuitry according to claim 1.

22. Circuitry for estimating whether an average current through an inductor of a power converter over a first phase of the power converter corresponds to a target average current value for the first phase, the circuitry comprising:
comparison circuitry configured to compare a signal indicative of current through the inductor during the first phase to a signal indicative of the target average current value; and
detection circuitry configured to detect, based on a control signal output by the comparison circuitry, a time at which the current through the inductor is equal to the target average current value,
wherein the circuitry is configured to output an indication of whether the current through the inductor corresponds to the target average current value based on the time at which the current through the inductor is equal to the target average current value.

23. Circuitry for monitoring a current through an inductor of a power converter during a first phase of operating of the power converter, the circuitry comprising:
a first counter configured to count a first number of clock cycles indicative of a total period of the first phase;
a second counter configured to count a second number of clock cycles indicative of a period from a start of the first phase to a threshold time at which a current of the inductor is equal to a target average current of the inductor during the first phase; and
comparison circuitry configured to compare the first number of clock cycles and the second number of clock cycles and to output a comparison signal indicative of whether the current through the inductor corresponds to the target average current, based on the comparison of the first number of clock cycles and the second number of clock cycles.

* * * * *